(12) United States Patent
Yamamoto

(10) Patent No.: US 7,295,287 B2
(45) Date of Patent: Nov. 13, 2007

(54) SUBSTRATE HOLDER AND EXPOSURE APPARATUS HAVING THE SAME

(75) Inventor: Kiyohito Yamamoto, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 457 days.

(21) Appl. No.: 10/972,497

(22) Filed: Oct. 26, 2004

(65) Prior Publication Data
US 2005/0094126 A1    May 5, 2005

(30) Foreign Application Priority Data
Oct. 31, 2003    (JP) .............................. 2003-372036

(51) Int. Cl.
G03B 27/58    (2006.01)
G03B 27/62    (2006.01)
(52) U.S. Cl. .......................................... 355/72; 355/75
(58) Field of Classification Search ................ 355/53, 355/72, 73, 75, 76, 77
See application file for complete search history.

(56) References Cited

U.S. PATENT DOCUMENTS 5,842,690 A * 12/1998 Lee et al. ..................... 269/21
6,414,744 B1   7/2002 Kuiper et al. ................. 355/75

FOREIGN PATENT DOCUMENTS

| JP | 9-270383 | 10/1997 |
|----|----------|---------|
| JP | 2862632 | 12/1998 |
| JP | 2000-349022 | 12/2000 |
| JP | 2001-156151 | 6/2001 |

* cited by examiner

*Primary Examiner*—Rodney Fuller
(74) *Attorney, Agent, or Firm*—Fitzpatrick, Cella, Harper & Scinto

(57) ABSTRACT

A substrate holding apparatus including a first holding member for attracting a first surface of a substrate, a second holding member which contacts a second surface, opposite to the first surface, of the substrate, in which the second holding member attracts the second surface, and a forcing member for forcing the first holding member toward the second holding member.

6 Claims, 8 Drawing Sheets

SUBSTRATE HOLDER AND EXPOSURE APPARATUS HAVING THE SAME

BACKGROUND OF THE INVENTION

The present invention relates to a technique for holding a substrate, such as a mask or a reticle, a semiconductor wafer, and a glass plate, for use with a semiconductor exposure apparatus.

A conventional substrate holder holds a reticle and a wafer in a semiconductor exposure apparatus through one surface of the substrate, such as its bottom or top surface, or its front or rear surface. For example, as shown in Japanese Patent Applications, Publication Nos. 9-270383, 2000-349022 and 2001-156151, an exposure stage holds a bottom surface of a substrate, and a substrate feeder for feeding a substrate to and from the stage holds one of the top and bottom surfaces of the substrate. While a substrate can be held longitudinally or perpendicularly, as disclosed in Japanese Patent No. 2,862,632, even this case allows the stage and substrate feeder to hold one surface of the substrate. In Japanese Patent No. 2,862,632, both the exposure stage and the substrate feeder for feeding the substrate to and from the stage hold the rear surface of the substrate.

If it is assumed, as disclosed in Japanese Patent Application, Publication No. 9-270383 and Japanese Patent No. 2,862,632, that the feeder's substrate holding member and the stage's substrate holding member hold the same plane of the substrate, the holding areas are restrained so as to avoid mutual interference. As a result, it becomes difficult to meet recent demands for high feed speed and increased holding power. In addition, it is difficult to correct a tilt that can occur between the feeder and the stage, and the correction requires an actuator-driven correction mechanism.

On the other hand, if it is assumed, as disclosed in Japanese Patent Application, Publication No. 2000-349022, that the feeder's substrate holding member and the stage's substrate holding member hold different planes of the substrate, the substrate holding members of the feeder and stage do not suffer from mutual restraints of the holding areas. In addition, the tilts between them are easily corrected without using the actuator. Instead, this case requires a structure that allows for distortions, such as a flat spring structure. As a result, it is difficult to maintain the surface position or posture of the substrate due to its elasticity when they singularly (by themselves) hold the substrate.

Japanese Patent No. 2,862,632 discloses an example of a tilt correction mechanism, although holding the same plane of the substrate. If the attraction power disappears by the substrate holding member when the top surface of the substrate is being attracted and held, the substrate drops and gets damaged. Japanese Patent Application, Publication No. 2001-156151, discloses a measure to prevent dropping of the substrate due to the reduced attraction power.

BRIEF SUMMARY OF THE INVENTION

Accordingly, it is an exemplified object of the present invention to provide a substrate holding technique that leads to improved holding power and holding accuracy of the substrate.

A substrate holder according to one aspect of the present invention includes a first holding member for attracting a first surface of a substrate, a second holding member that contacts a second surface of the substrate at an opposite side of the first surface, and a forcing member for forcing the first holding member against the second holding member.

An exposure apparatus according another aspect of the present invention for exposing a pattern onto a substrate or for exposing a pattern on a substrate onto an object includes the above substrate holder as a holding system.

A device manufacturing method according to still another aspect of the present invention includes the steps of exposing an object using the above exposure apparatus, and developing the exposed object. Claims for a device fabricating method for performing operations similar to that of the above exposure apparatus cover devices as intermediate and final products. Such devices includes semiconductor chips, such as LSIs and VLSIs, CCDs, LCDs, magnetic sensors, thin film magnetic heads, and the like.

Other objects and further features of the present invention will become readily apparent from the following description of the preferred embodiments with reference to the accompanying drawings.

DETAILED DESCRIPTION OF THE PREFERRED EMBODIMENTS

Figure 1:
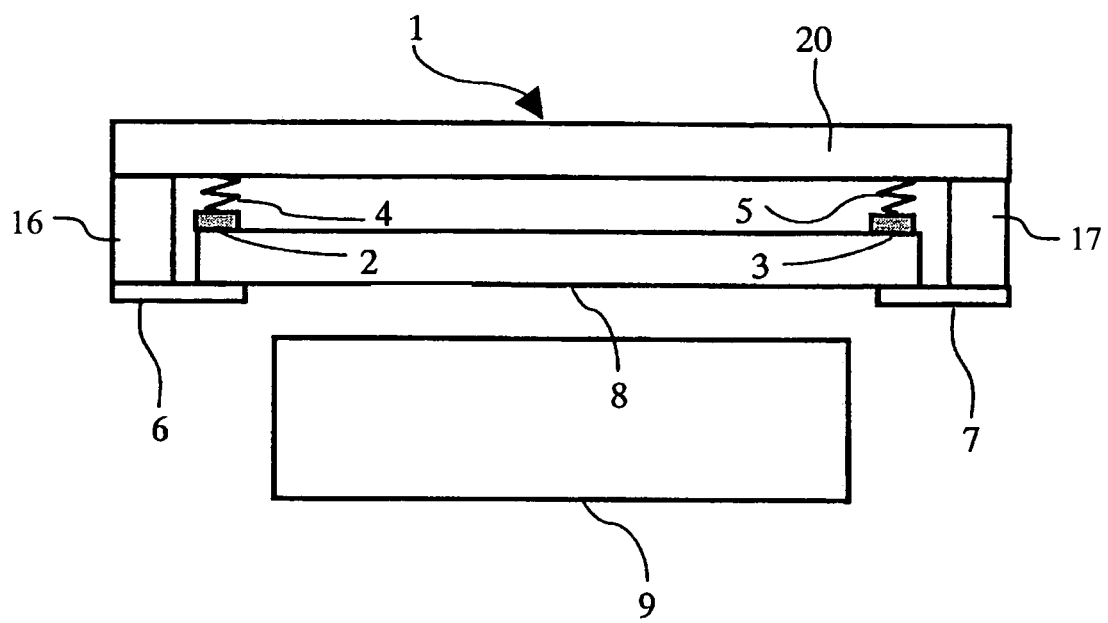
FIG. 1 is a view showing a structure of a substrate holder applied to a substrate feeder according to a first embodiment of the present invention.

A substrate holder includes a first holding member for attracting a first surface of a substrate, a second holding member that contacts a second surface of the substrate at an opposite side of the first surface, and a forcing member for forcing the first holding member against the second holding member. As a result, the substrate is sandwiched by the first and second holding members with greater holding power. The outer surface of the substrate is pressed against the second holding member, and the second holding member restricts the surface position with high positional accuracy. The surface accuracy of a held substrate can be maintained or corrected and a substrate position can be measured during feeding by properly setting the surface accuracy of a contact surface of the second holding member with the substrate and a substrate support position by the first and second holding members. Therefore, a positional offset amount of the substrate, the surface accuracy, etc., can be measured without using an additional support mechanism for position measurements.

A drop prevention means in Japanese Patent Application, Publication No. 2001-156151, receives a substrate released from attraction when the attraction force disappears, and is usually spaced from the substrate. Therefore, there is no operation to improve the holding power or there is no operation to position the surface position of the substrate, or to maintain or to correct the surface accuracy. The forcing member is, for example, a flat spring, and serves as a tilt correction mechanism for arranging the substrate holding surface of the first holding member parallel to the substrate holding surface of a delivery partner, while the substrate is being delivered to the other substrate holder. Therefore, the first holding member can hold the substrate, while the other substrate holder holds the substrate, and reduce positional offsets of the substrate while the substrate is being delivered.

The above substrate holder further includes means for driving the substrate between the substrate holding position and the holding release position so as to retreat to the holding release position the second holding member from the feed path of the substrate to be delivered, when delivering the substrate to the other substrate holder using the drive means, avoiding interference with the substrate.

The above substrate holder, characterized in holding the substrate in a horizontal position from above by allowing the first holding member to attract the top surface of the substrate, and the second holding member to support the bottom surface of the substrate, is particularly suitable as a substrate holder for holding the substrate in a horizontal position from above.

An exposure apparatus including the above substrate holder is used to hold an exposed original form, such as a reticle or mask, and a substrate to be exposed, such as a semiconductor wafer and a glass plate, in a feed robot for feeding these substrates, a stage for positioning these substrates, etc.

For example, when the substrate is a reticle and the substrate holder is formed in a reticle feed system, the present invention holds both surfaces of the reticle, feeds it at a high speed, measures a substrate position during feeding by the feed system, and implements a delivery mechanism that can provide an accurate delivery of the reticle through simultaneous attractions with the reticle stage. Thereby, the exposure apparatus has improved throughput and feed accuracy.

A description will be given of embodiments of the present invention with reference to the drawings.

A description will be given of a first embodiment, in which a substrate is delivered between a stage and a feed mechanism by a substrate holder in an exposure apparatus, wherein an object to be held is exemplarily a reticle. FIG. 1 shows a structure of a substrate retainer in a substrate feeder according to one embodiment of the present invention. The substrate holder in FIG. 1 holds a substrate 8 in a substrate feeder, and includes top-surface holding members 2 and 3 as a first substrate holder, bottom-surface holding members 6 and 7 as a second substrate holder, and drive units 16, 17 for driving the bottom-surface holding members 6 and 7. The top-surface holding members 2 and 3 attract and hold the substrate using a vacuum or an electrostatic attraction force, and are attached to a feed member 20, such as a feed hand, via forcing members 4 and 5 for forcing the top-surface holding members 2 and 3 against the bottom-surface holding members 6 and 7. The forcing members 4 and 5 are, for example, a flat spring. The forcing members 4 and 5 compress the top-surface holding members 2 and 3 against the substrate 8, and the substrate 8 against the bottom-surface holding members 6 and 7, enabling the substrate 8 to be held through both its surfaces. The forcing members 4 and 5 serve as a tilt correction mechanism for correcting tilts of the top-surface holding members 2 and 3 relative to the top surface of the substrate mounted on the stage 9, while the substrate is being delivered to the stage 9 as the other substrate holder, enabling the substrate to be held between the stage 9 and the top-surface holding members 2 and 3.

The bottom-surface holding members 6 and 7 include, for example, an open/close mechanism that opens to the outside of the substrate edge surface so as to prevent interference during delivery of the substrate to the other substrate holder. On the other hand, the open/close mechanism closes under the substrate during feeding of the substrate, and holds the substrate using the top-surface holding members 2 and 3, enhancing the holding power and preventing dropping of the substrate when the holding power by the top-surface holding members 2 and 3 decreases due to feeding trouble.

The holding members 6 and 7 maintain the surface accuracy of the contact surface in holding the substrate, and, thus, the surface accuracy of the substrate during feeding. It is also possible to measure the alignment mark and surface accuracy of the reticle in the feed path, even before the substrate is delivered to the stage 9.

A description will be given of a sequence of the substrate delivery between the substrate holder and the stage in FIG. 1. A description will now be given of a sequence to deliver the substrate to the substrate holder from the stage with reference to FIGS. 2 and 3. Suppose that the stage 9 holds the substrate 8 horizontally or approximately horizontally at the initial state of the delivery. The stage 9 is spaced from the substrate holder 1 in a Z or vertical direction, and the substrate holder 1 does not hold the substrate 8. In order to prevent interference with the substrate 8, the bottom-surface holding members 6 and 7 open to the outside from the edge surface of the substrate holder 1 in the substrate holder 1 (see FIG. 3A).

Figure 2:
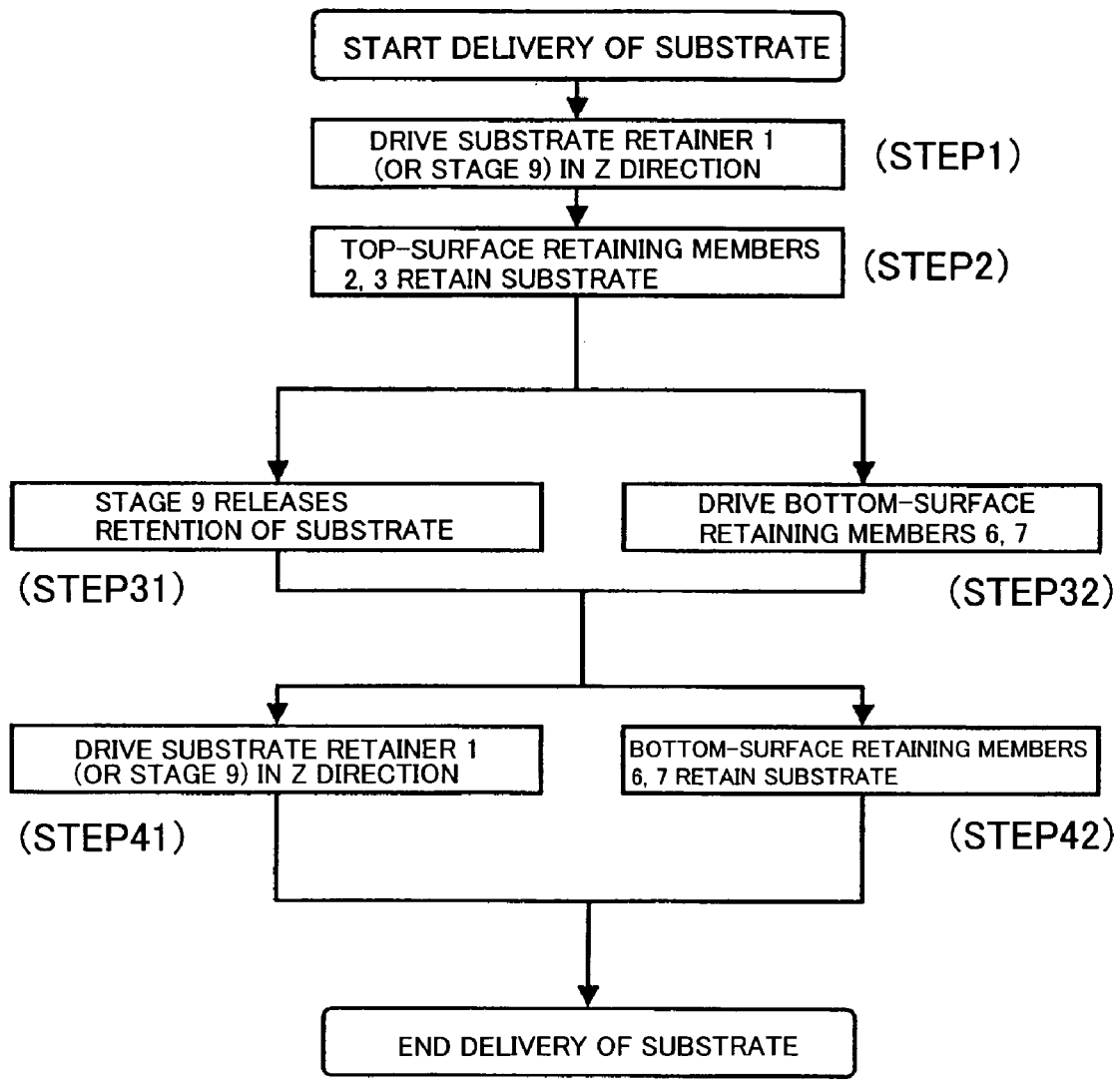
FIG. 2 is a flowchart showing a delivery from a stage to the substrate holder.

In order for the substrate holder 1 to receive the substrate, the substrate holder 1 is moved down in the Z direction and the stage 9 is moved up in the Z direction, so that the top-surface holding members 2 and 3 for the substrate can contact the top surface of the substrate (step 1 in FIG. 2). The top-surface holding members 2 and 3 contact the top surface of the substrate 8 from the top, and hold the substrate 8 (step 2 in FIG. 2 and FIG. 3B). When the parallelism between the stage 9 and the substrate holder 1 is insufficient, or when the substrate 8 has such a low surface accuracy that the parallelism is insufficient between the top surface of the substrate 8 and the substrate holder 1, the forcing members 4 and 5, as the tilt correction mechanism, can arrange the top-surface holding members 2 and 3 parallel to the top surface of the substrate 8. The delivery time is shortened by parallel processing of preparations of the substrate holdings by these top-surface holding members 2 and 3 (which include, for example, voltage applications for an electrostatic chuck or vacuum suction for vacuum holdings) and driving in the Z direction.

After it is confirmed that the top-surface holding members 2 and 3 hold the substrate 8, the stage 9 releases the substrate (step 31 in FIG. 2). These simultaneous holdings of the substrate between the delivery mechanism and delivered mechanism improve the positional accuracy of the substrate before and after the delivery.

The bottom-surface holding members 6 and 7 of the substrate holder 1 are closed, and moved under the substrate 8 by the drive units 16 and 17 (step 32 in FIG. 2). Step 32 can be parallel-processed with step 31. When the substrate is released from the stage 9 (step 31) and the bottom-surface holding members 6 and 7 are moved (step 32) (FIG. 3C), the substrate holder 1 is moved up in the Z direction or the stage 9 is moved down in the Z direction (step 41 in FIG. 2). Thereby, the bottom surface of the substrate 8 contacts the bottom-surface holding members 6 and 7 by the forces of the forcing members 4 and 5, and is separated from the top surface of the stage 9 in the Z direction. As discussed, the substrate holder 1 receives the substrate 8 from the stage 9.

If the bottom-surface holding members 6 and 7 are provided with a control mechanism, such as an electrostatic chuck and vacuum suction, so as to improve the holding power of the substrate, the substrate 8 is separated and spaced from the stage 9 in the Z direction up to a contact position with the bottom-surface holding members 6 and 7, and then, the bottom-surface holding members 6 and 7 attract and hold the substrate 8. This process can be conducted in parallel to step 41 (step 42 in FIG. 2).

Figures 3A, 3B, 3C, 3D:
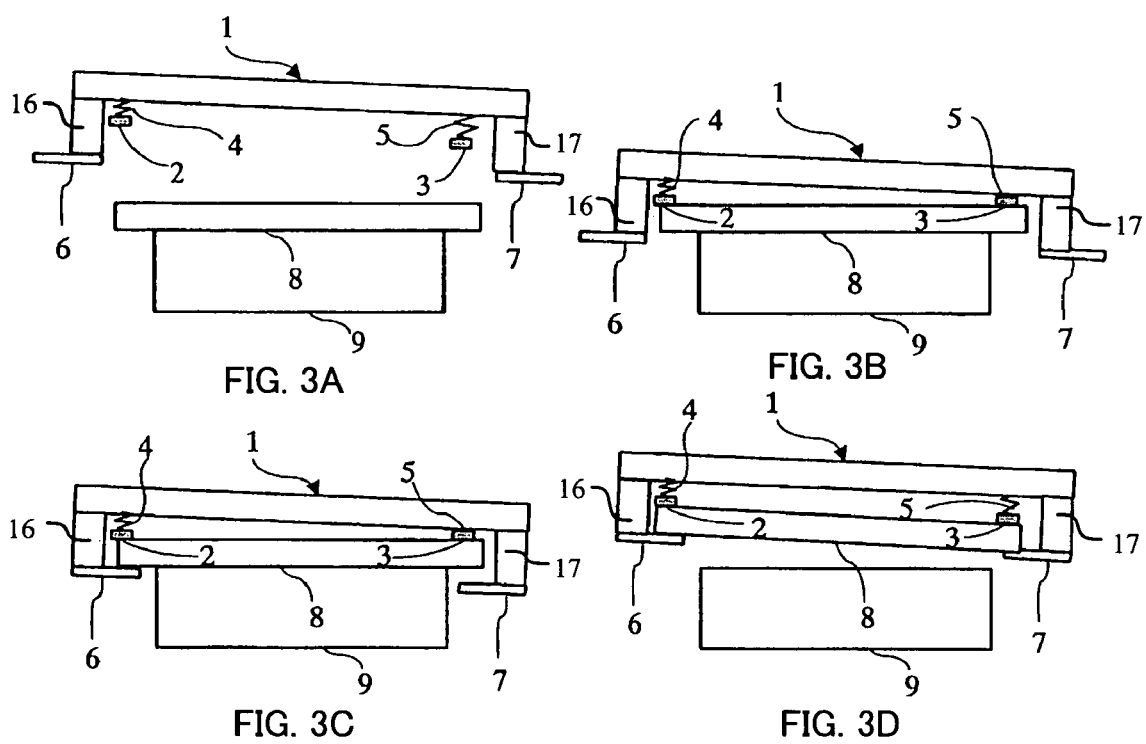
FIGS. 3A-3D are explanatory views of the delivery of the substrate.

The delivery thus ends from the stage 9 to the substrate holder 1 (FIG. 3D).

A description will now be given of a delivery of the substrate 8 from the substrate holder 1 to the stage 9, with reference to FIGS. 3 and 4. Suppose that the top-surface holding members 2 and 3 attract and hold the substrate 8 in the substrate holder 1 at the initial state of the delivery. The stage 9 is spaced from the substrate holder 1, and does not hold the substrate 8. The bottom-surface holding members 6 and 7 in the substrate holder 1 are located under the bottom surface of the substrate 8 and hold the substrate, preventing dropping of the substrate 8 (FIG. 3D).

Figure 4:
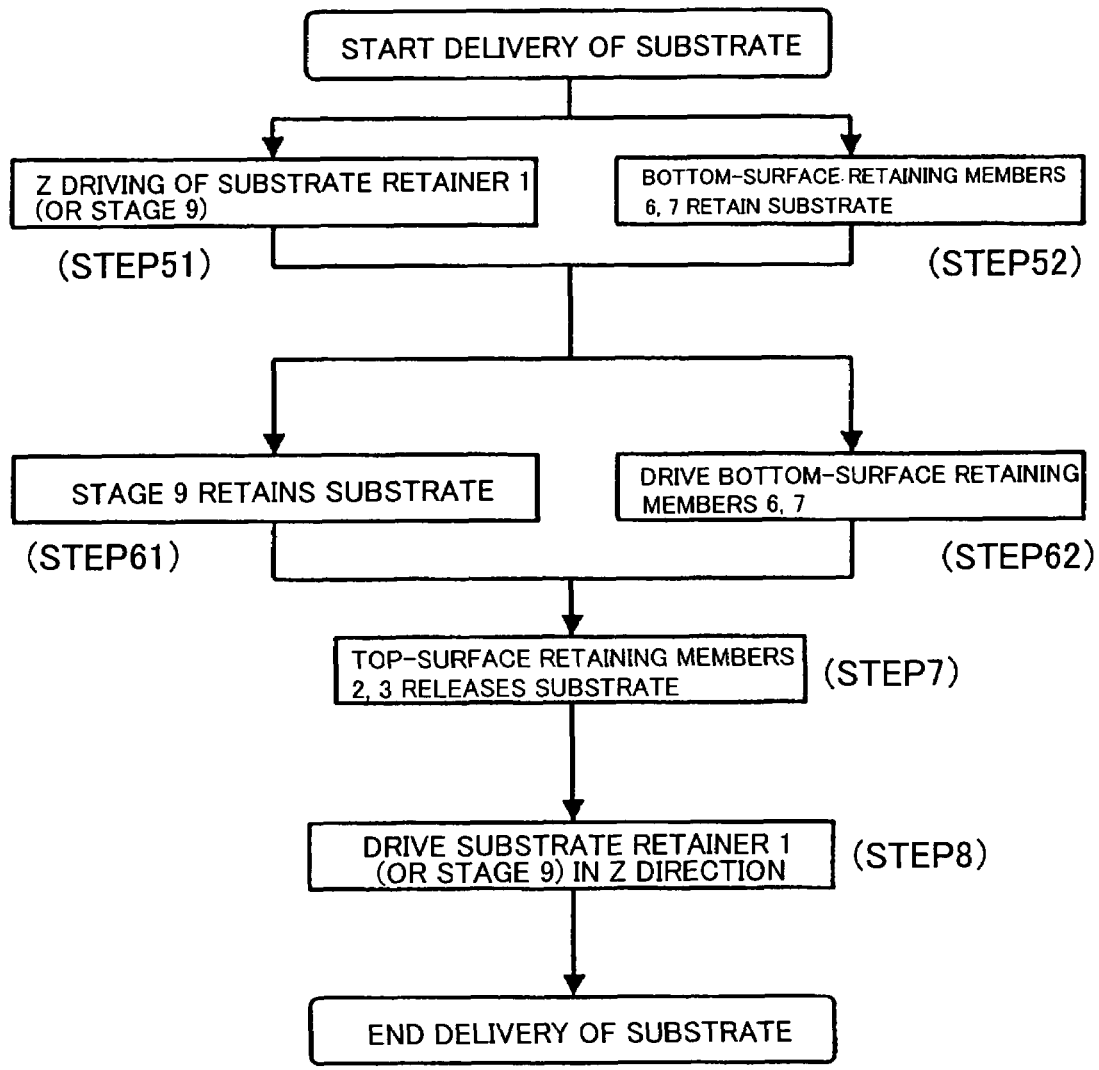
FIG. 4 is a flowchart showing the delivery from the substrate holder to the stage.

In order for the stage 9 to receive the substrate 8, the substrate holder 1 is moved down in the Z direction, or the stage 9 is moved up in the Z direction, so that the substrate holding member of the stage 9 contacts the bottom surface of the substrate 8 (step 51 in FIG. 4).

Following the actions in steps 51 and 52, the stage 9 starts to attract the substrate 8 (FIG. 3C and step 61 in FIG. 4). Similar to FIG. 2, the simultaneous holdings of the substrate between the delivery mechanism and delivered mechanism improve the positional accuracy of the substrate before and after the delivery.

When the parallelism between the stage 9 and the substrate holder 1 is insufficient, or when the substrate 8 has such a low surface accuracy that the parallelism is insufficient between the top surface of the substrate 8 and the substrate holder 1, the forcing members 4 and 5, as the tilt correction mechanism, can arrange the top-surface holding members 2 and 3 parallel to the top surface of the substrate 8.

After it is confirmed that the stage 9 holds the substrate 8, the top-surface holding members 2 and 3 release the substrate (step 7 in FIG. 4). The bottom-surface holding members 6 and 7 of the substrate holder 1 are opened, and moved away from the bottom surface of the substrate by the drive units 16 and 17 (step 62 in FIG. 4). Step 62 can be processed in parallel to steps 61 and 7.

When the bottom-surface holding members 6 and 7 are retreated (step 62) and the substrate is released from the stage top-surface holding members 2 and 3 (FIG. 3B), the stage 9 receives the substrate 8. In order to separate the top surface of the substrate 8 from the bottom surface of the substrate holder 1 in the Z direction, the substrate holder 1 is moved up in the Z direction or the stage 9 is moved down in the Z direction (step 8 in FIG. 4).

The delivery thus ends from the substrate holder to the stage 9 (FIG. 3A).

Thus, the substrate holder 1 can hold both surfaces of the substrate 8, consequently improving the substrate holding power during feeding, and accelerating the feed. The delivery of the substrate while the tilt is corrected can reduce positional offsets of the substrate and provide accurate feeding.

Second Embodiment

Figure 5:
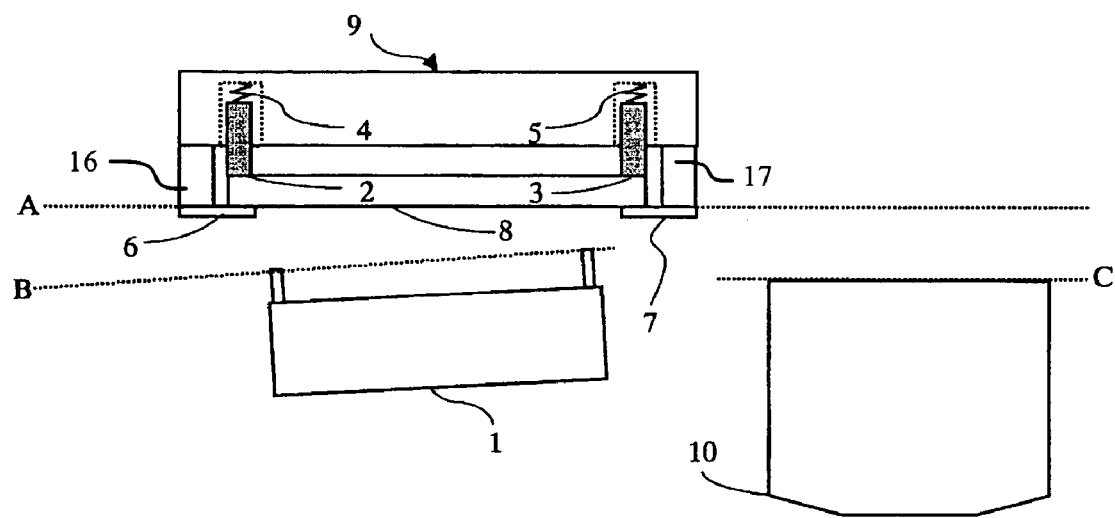
FIG. 5 is a view showing a structure of a substrate holder applied to a substrate feeder according to a second embodiment of the present invention.

A description will be given of a second embodiment, in which a substrate is delivered between the stage and the feed mechanism by a substrate holder in an exposure apparatus, wherein an object to be held is exemplarily a reticle. FIG. 5 shows a structure of a substrate holder in the reticle stage according to the second embodiment of the present invention. Unlike the first embodiment, this embodiment provides the stage 9 with a mechanism for holding both surfaces of the substrate, which includes the top-surface holding members 2 and 3, the forcing members (or tilt correcting mechanisms) 4 and 5, the bottom-surface holding members 6 and 7, and driving units 16 and 17. The substrate holding members of the top-surface holding members 2 and 3 are, for example, an electrostatic chuck, and the top-surface holding members 2 and 3 are pins of the electrostatic chuck. Each pin is fixed as a spring onto the stage 9, and corrects tilts in delivering the substrate 8.

The center of gravity of the substrate contact surfaces of the top-surface holding members 2 and 3 is aligned with that of the bottom-surface holding members 6 and 7 when the stage 9 holds the substrate 8 so that the substrate is held without deformation. As a result, the maintained surface accuracy of the bottom-surface holding members 6 and 7 maintain the parallelism of the bottom surfaces of the substrates. More specifically, the surface accuracy of the bottom surface of the substrate is maintained during exposure by maintaining the surface accuracy of the bottom-surface holding members 6 and 7, so that the bottom surface A of the substrate becomes parallel, for example, to the top surface C of an exposure lens 10. As a result, even with the low surface accuracy of the bottom surface A of the substrate held on the stage, the tilt correction mechanism 4 maintains the precision during the delivery of the substrate. Similar to the first embodiment, this embodiment can effect fast feeding of the substrate and delivery of the substrate with good positional precision.

This embodiment can deliver the substrate while holding both surfaces of the substrate, consequently enlarging the holding area, improving the holding power, and accelerating the substrate feeding. The tilt correction of the substrate delivery surface improves the delivery accuracy and provides a holding mechanism that can maintain the surface accuracy of the substrate.

The present invention is not limited to these embodiments. The inventive sandwich holding mechanism is not limited to the feed mechanism and the stage, but is applicable to any mechanism for holding a substrate, such as a substrate stocker and an alignment mechanism. In addition, the present invention is not limited to the exposure apparatus, and is applicable to any mechanism for holding a substrate in a precision machine or a precision processing machine, such as an electron microscope.

The surface accuracy of the bottom surface of the substrate is not limited to a relationship between the stage and the lens. The present invention is applicable to any mechanism for maintaining the accuracy of the bottom surface away from another support structure, such as a stage to an alignment measurement mechanism, and a feed mechanism to an alignment mechanism.

Third Embodiment

Figure 6:
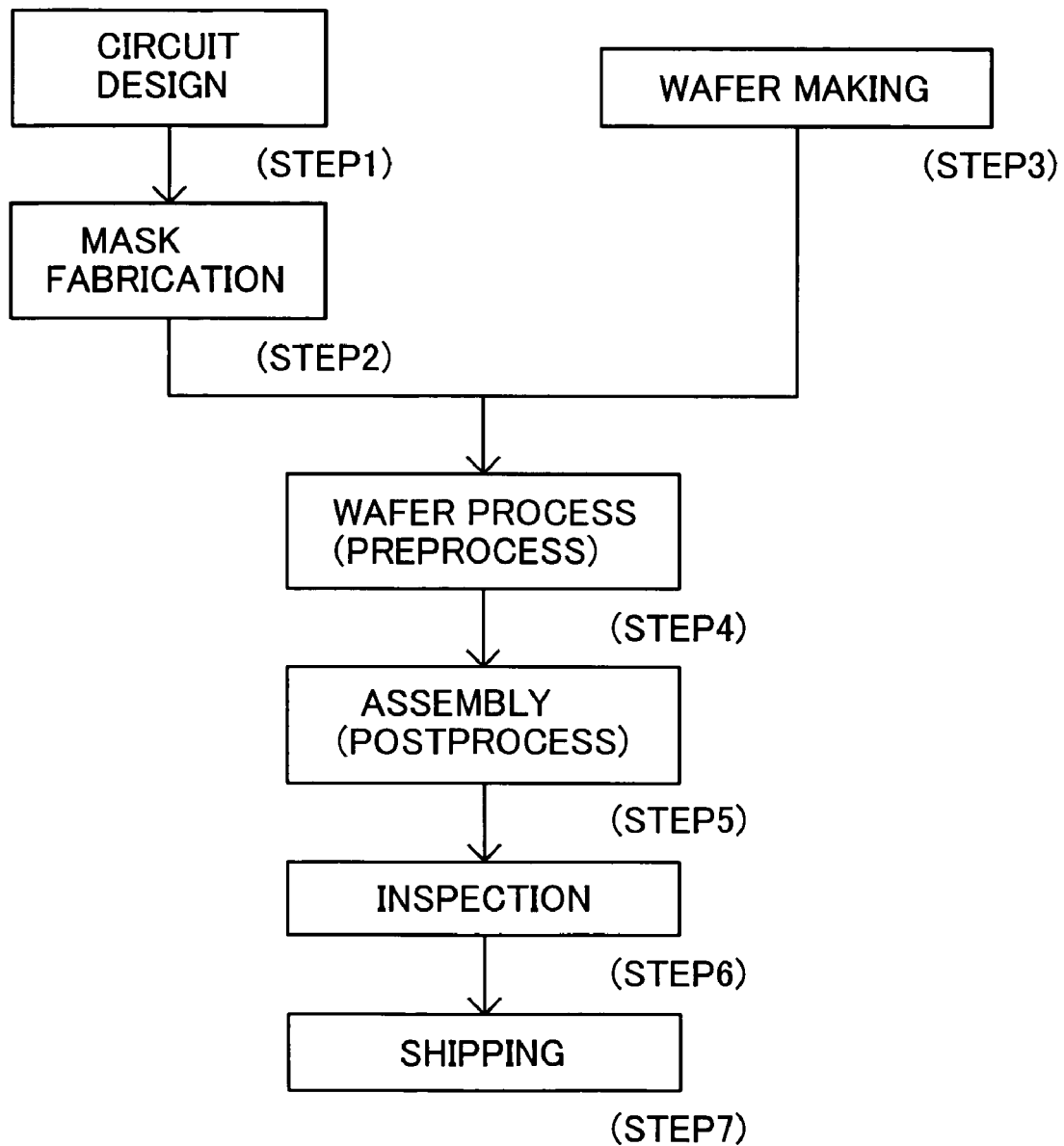
FIG. 6 is a flowchart for explaining a device manufacturing process.

A description will now be given of an embodiment of a device manufacturing method using the above exposure apparatus having the substrate holder. FIG. 6 is a flowchart for explaining a fabrication of fine devices (i.e., semiconductor chips, such as ICs and LSIs, LCDs, CCDs, thin-film magnetic heads, and micro-machines). Step 1 (circuit design) designs a pattern of a device. Step 2 (mask production) forms a mask having a designed pattern. Step 3 (wafer production) manufactures a wafer using materials such as silicon and glass. Step 4 (wafer process), which is also referred to as a pretreatment, forms actual circuitry on the wafer through photolithography using the reticle and wafer. Step 5 (assembly), which is also referred to as a post-treatment, forms into a semiconductor chip the wafer formed in step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

Figure 7:
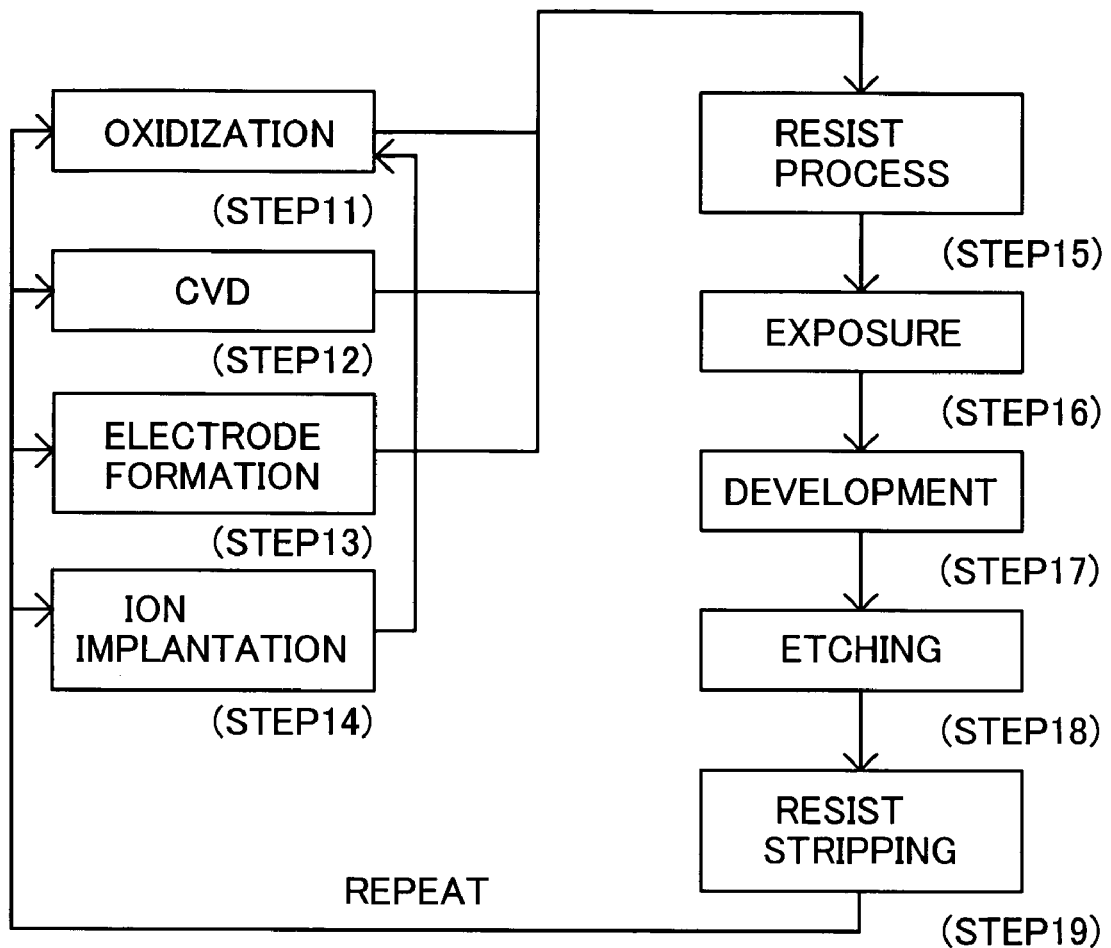
FIG. 7 is a view for explaining a wafer process in FIG. 6.

FIG. 7 is a detailed flowchart of the wafer process in Step 4. Step 11 (oxidation) oxidizes the surface of the wafer. Step 12 (CVD) forms an insulating coating on the surface of the wafer. Step 13 (electrode formation) forms electrodes on the wafer by vapor deposition. Step 14 (ion implantation) implants ions into the wafer. Step 15 (resist process) applies a photosensitive material onto the wafer. Step 16 (exposure) uses the exposure apparatus having the above substrate holder to expose a circuit pattern on the mask onto the wafer. Step 17 (development) develops the exposed wafer. Step 18 (etching) removes portions other than the developed resist image. Step 19 (resist stripping) removes the unused resist after etching. These steps are repeated, and multi-layer circuit patterns are formed on the wafer. The manufacturing method of the instant embodiment may manufacture highly integrated devices with reduced costs, which have been difficult to manufacture.

Fourth Embodiment

A description will now be given of an exemplary structure of an exposure apparatus that includes the above substrate holder, with reference to FIG. 8 as a schematic block diagram.

An exposure apparatus 100 is a projection exposure apparatus that uses, as illumination light for exposure, EUV light (with a wavelength of, e.g., 13.4 nm) to expose onto an object 140 a circuit pattern on a reticle 120, for example, in a step-and-repeat manner and a step-and-scan manner. This exposure apparatus is suitable for a lithography process on the order of less than a submicron or a quarter micron, and this embodiment addresses the step-and-scan exposure apparatus (also referred to as a "scanner") as an example. The "step-and-scan manner", as used herein, is an exposure method that exposes a mask pattern onto a wafer by continuously scanning the wafer relative to the mask, and by moving, after a shot of exposure, the wafer stepwise to the next exposure area to be shot. The "step-and-repeat manner" is another mode of an exposure method that moves a wafer stepwise to an exposure area for the next shot for every shot of cell projection onto the wafer.

Figure 8:
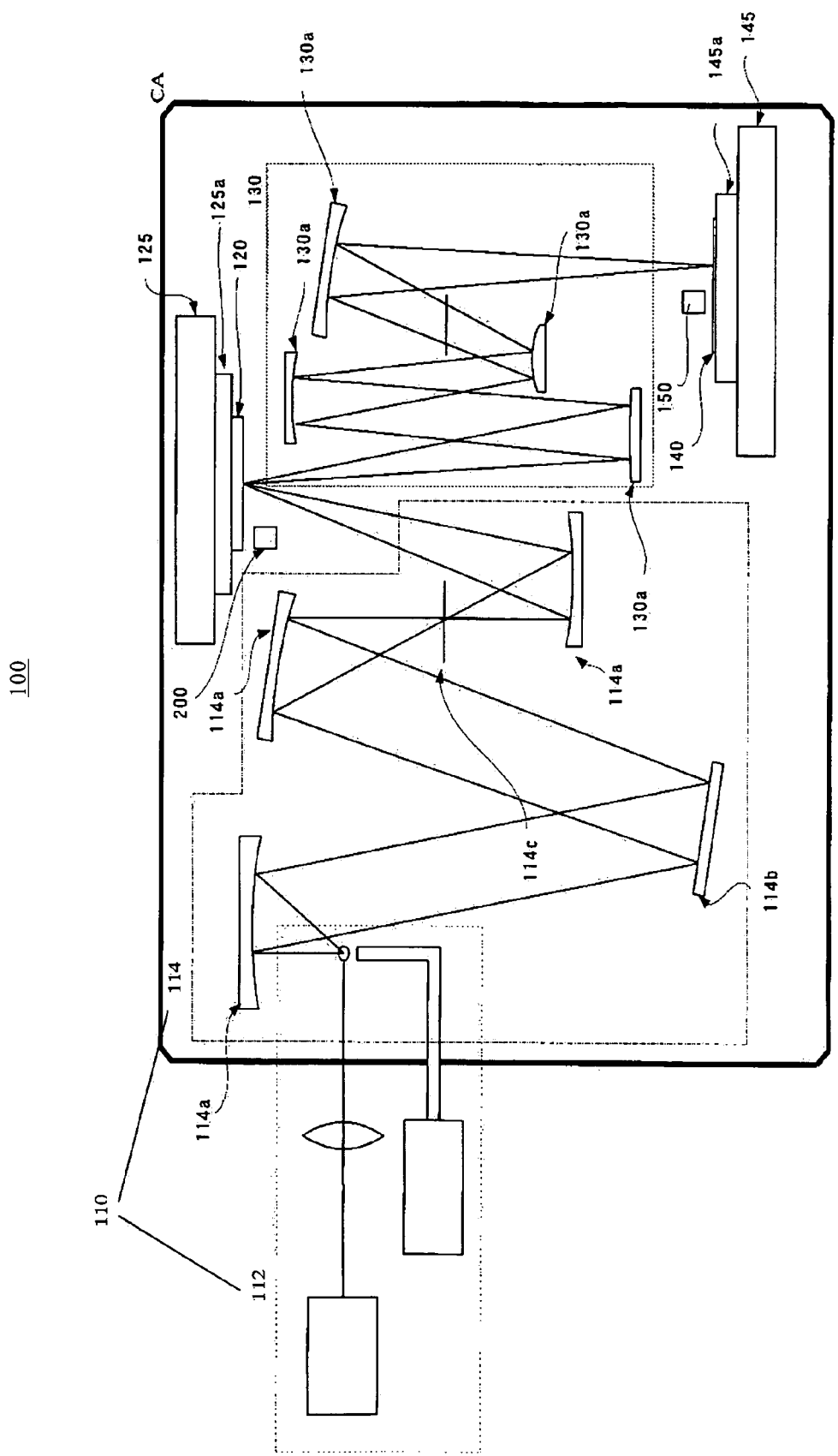
FIG. 8 is a schematic view of a structure of an exposure apparatus.

Referring to FIG. 8, the exposure apparatus 100 includes an illumination apparatus 110, a reticle 120, a reticle stage 125 that mounts the reticle 120, a projection optical system 130, a wafer stage 145 that mounts the object to be exposed 140, a focus position detection mechanism 150, and a position detector 200.

A vacuum chamber CA preferably maintains at least an optical path in a vacuum atmosphere, as shown in FIG. 8, through which optical path the EUV light passes or an entire optical system, since the EUV light has a low transmittance to air and causes contaminations through reactions with residual gas, such as polymer organic gas.

The illumination apparatus 110 uses arc-shaped EUV light, for example, with a wavelength of 13.4 nm corresponding to an arc-shaped field of the projection optical system 130 to illuminate the reticle 120, and includes an EUV light source 112 and an illumination optical system 114.

The EUV light source 112 employs, for example, a laser plasma light source. It generates high temperature plasma by irradiating a pulsed laser beam with high intensity onto a target material in a vacuum chamber, and uses the EUV light, for example, with a wavelength of about 13 nm, which has been emitted from the plasma. The target material may use a metallic thin film, an inert gas, a liquid-drop, etc., and the target supply unit may use a gas jet, and so on. The pulse laser is usually driven with a higher repetitive frequency, such as several kHz, for increased average intensity of radiated EUV light.

The illumination optical system 114 is to introduce the EUV light from the EUV light source 112 to the reticle 120, and includes plural multilayer mirrors or oblique incidence mirrors (or condenser mirrors) 114*a*, an optical integrator 114*b*, etc. The condenser mirror 114*a* serves to collect the EUV light that is isotropically irradiated from the laser plasma. The optical integrator 114*b* serves to uniformly illuminate the reticle 120 with a predetermined NA. The illumination optical system 114 further includes an (angle-of-view restricting) aperture 114*c* to limit the illumination area to an arc shape at a position conjugate with the reticle 120.

The reticle 120 is a reflection reticle that has a circuit pattern or an image to be transferred, and is supported and driven by the reticle stage 125. The diffracted light from the reticle 120 is reflected by the projection optical system 130 and projected onto the object 140. The reticle 120 and the object 140 are arranged optically conjugate with each other. The exposure apparatus 100 is a step-and-scan exposure apparatus, and projects a reduced size of the pattern on the reticle 120 on the object 140 by scanning the reticle 120 and the object 140.

The reticle stage 125 supports the reticle 120 via a reticle chuck 125*a*, and is connected to a moving mechanism (not shown). The moving mechanism (not shown) can include a linear motor, etc., to drive the reticle stage 125 in XYZ directions and around rotational directions of each axis and to move the reticle 120. The exposure apparatus 100 assigns the direction X to scan the reticle 120 or the object 140, a direction Y perpendicular to the direction X, and a direction Z perpendicular to the reticle 120 or the object 140.

The projection optical system 130 uses plural multilayer mirrors 130*a* to project a reduced size of a pattern formed on the reticle 120 onto the object 140. Since the smaller number of mirrors 130*a* would enhance the use efficiency of the EUV light, but make aberrational corrections difficult, the number of mirrors is about four to six. For a wide exposure area with the small number of mirrors, the reticle 120 and object 140 are simultaneously scanned to transfer a wide area that is an arch-shaped area or a ring field apart from the optical axis by a predetermined distance. The projection optical system 130 has an NA of about 0.2 to 0.3. The mirror 130*a* makes its substrate of a rigid and hard material with low coefficients of thermal expansion, such as low expansion coefficient glass or silicon carbide, shapes a predetermined (e.g., concave or convex spherical or aspheric) reflective surface through grounding and polishing, and then makes a multilayer coating, for example, of molybdenum/silicon, on the reflective surface. When the EUV light does not have constant incident angles upon the mirror 130*a*, a multilayer coating with a constant film cycle enhances the reflectance depending upon a location and offsets the wavelength of the EUV light. Accordingly, a film cycle distribution is arranged so that the EUV light with the same wavelength may be reflected efficiently on a mirror surface.

The instant embodiment uses a wafer as the object to be exposed 140, but it may include a liquid crystal substrate and a wide range of other objects to be exposed. A photoresist is applied onto the object 140.

An object to be exposed 140 is held onto the wafer stage 145 by a wafer chuck 145*a*. Similar to the reticle stage 125, the wafer stage 145 moves the object 140, for example, using a linear stage in XYZ-axes directions and rotational directions around the respective axes. The positions of the reticle stage 125 and wafer stage 145 are monitored, for example, by a laser interferometer, and driven at a constant speed ratio.

A focus position detection mechanism 150 measures a focus position on the wafer surface, controls a position and an angle of the wafer stage 145, and maintains the surface of the object 140 at the best imaging position for the projection optical system 130 all the time during exposure.

The position detector 200 is a TTR alignment optical system for detecting an arrangement between the reticle 120 and the object 140 directly or indirectly.

Further, the present invention is not limited to these preferred embodiments, and various variations and modifications may be made without departing from the scope of the present invention.

This application claims priority from Japanese Patent Application No. 2003-372036, filed Oct. 31, 2003, which is hereby incorporated by reference herein.

What is claimed is:

1. A substrate holding apparatus comprising:
    a first holding member for attracting a first surface of a substrate;
    a second holding member which contacts a second surface, opposite to the first surface, of the substrate, wherein said second holding member attracts the second surface; and
    a forcing member for forcing said first holding member toward said second holding member.

2. A substrate holder according to claim 1, further comprising a drive unit for moving said second holding member to one of a first position opposing said first holding member and a second position different from the first position.

3. A substrate holder according to claim 1, wherein said first holding member holds the substrate in a horizontal position from above.

4. A substrate holding apparatus comprising:
    a first holding member for attracting a first surface of a substrate, wherein said first holding member holds the substrate in a horizontal position from above;
    a second holding member which contacts a second surface, opposite to the first surface, of the substrate; and
    a forcing member for forcing said first holding member toward said second holding member.

5. A substrate holder according to claim 4, further comprising a drive unit for moving said second holding member to one of a first position opposing said first holding member and a second position different from the first position.

6. A substrate holder according to claim 4, wherein said second holding member attracts the second surface.

* * * * *